(12) United States Patent
Altan et al.

(10) Patent No.: US 12,210,365 B2
(45) Date of Patent: Jan. 28, 2025

(54) APPARATUS FOR POLE FREQUENCY TRACKING IN AMPLIFIERS AND ASSOCIATED METHODS

(71) Applicant: Silicon Laboratories Inc., Austin, TX (US)

(72) Inventors: Mehmet Akif Altan, Oslo (NO); Steffen Skaug, Oslo (NO)

(73) Assignee: Silicon Laboratories Inc., Austin, TX (US)

( * ) Notice: Subject to any disclaimer, the term of this patent is extended or adjusted under 35 U.S.C. 154(b) by 396 days.

(21) Appl. No.: 16/848,424

(22) Filed: Apr. 14, 2020

(65) Prior Publication Data

US 2021/0320635 A1 Oct. 14, 2021

(51) Int. Cl.
*H03F 3/45* (2006.01)
*G05F 1/565* (2006.01)
*G05F 1/575* (2006.01)

(52) U.S. Cl.
CPC .............. *G05F 1/565* (2013.01); *G05F 1/575* (2013.01); *H03F 3/45183* (2013.01); *H03F 2200/151* (2013.01); *H03F 2200/153* (2013.01); *H03F 2203/45264* (2013.01); *H03F 2203/45544* (2013.01); *H03F 2203/45594* (2013.01)

(58) Field of Classification Search
CPC ..... H03F 1/14; H03F 1/34; H03F 3/45; H03F 3/45179; H03F 3/45183; H03F 2200/151; H03F 2200/153; H03F 2203/45264; H03F 2203/45544; H03F 2203/45594; H03F 2203/45372; H03F 2203/45392; H03F 3/45188; G05F 1/565; G05F 1/575
USPC ............................... 330/252, 253, 260, 292
See application file for complete search history.

(56) References Cited

U.S. PATENT DOCUMENTS

| 10,175,707 | B1 | 8/2019 | Wei | |
| 11,025,213 | B2* | 6/2021 | Roy | ..................... H03F 3/45246 |
| 2010/0045380 | A1* | 2/2010 | Ivanov | ..................... G05F 1/575 |
| | | | | 330/253 |
| 2014/0368176 | A1* | 12/2014 | Mandal | ................... G05F 1/575 |
| | | | | 323/280 |

* cited by examiner

Primary Examiner — Andrea Lindgren Baltzell
Assistant Examiner — Khiem D Nguyen
(74) Attorney, Agent, or Firm — Zagorin Cave LLP

(57) ABSTRACT

An apparatus includes an amplifier. The amplifier has two inputs, and an output. The amplifier has a pole in its transfer function. The frequency of the pole depends on the output current of the amplifier. The amplifier further includes a pole frequency tracking (PFT) circuit. The PFT circuit includes a source follower circuit.

20 Claims, 10 Drawing Sheets

APPARATUS FOR POLE FREQUENCY TRACKING IN AMPLIFIERS AND ASSOCIATED METHODS

TECHNICAL FIELD

The disclosure relates generally to electronic circuitry, such as amplifiers or amplifier circuitry and, more particularly, to apparatus for pole frequency tracking in amplifiers, and associated methods.

BACKGROUND

With advances in technology, an increasing number of circuit elements have been integrated into devices, such as integrated circuits (ICs). Furthermore, a growing number of devices, such as ICs, or subsystems, have been integrated into products. With developments such as the Internet of Things (IoT), this trend is expected to continue.

The circuit elements sometimes include amplifiers. Amplifiers typically are used to drive varying loads. For example, in some circumstances, the varying nature of the load results in changes in the output current of the amplifier.

The description in this section and any corresponding figure(s) are included as background information materials. The materials in this section should not be considered as an admission that such materials constitute prior art to the present patent application.

SUMMARY

A variety of apparatus and associated methods are contemplated according to exemplary embodiments. According to one exemplary embodiment, an apparatus includes an amplifier. The amplifier has two inputs, and an output. The amplifier has a pole in its transfer function. The frequency of the pole depends on the output current of the amplifier. The amplifier further includes a pole frequency tracking (PFT) circuit. The PFT circuit includes a source follower circuit.

According to another exemplary embodiment, an apparatus includes an operational amplifier that has two inputs and an output. The operational amplifier includes a first stage to receive the input signals, and a second stage coupled to the first stage. The second stage includes a PFT circuit. The PFT circuit includes a feedback loop to provide a feedback signal as a function of an output current of the amplifier. The operational amplifier also includes a third stage coupled to the second stage. The third stage provides the output current of the amplifier at the output.

According to another exemplary embodiment, a method of operating an amplifier is disclosed. The amplifier has an output to drive a load. A frequency of a pole of the amplifier varies as a function of an output current of the amplifier. The method includes using a PFT circuit to provide a feedback signal to preserve the stability of the amplifier.

BRIEF DESCRIPTION OF THE DRAWINGS

The appended drawings illustrate only exemplary embodiments and therefore should not be considered as limiting the scope of the application or of the claimed subject-matter. Persons of ordinary skill in the art will appreciate that the disclosed concepts lend themselves to other equally effective embodiments. In the drawings, the same numeral designators used in more than one drawing denote the same, similar, or equivalent functionality, components, or blocks.

DETAILED DESCRIPTION

Figure 1:
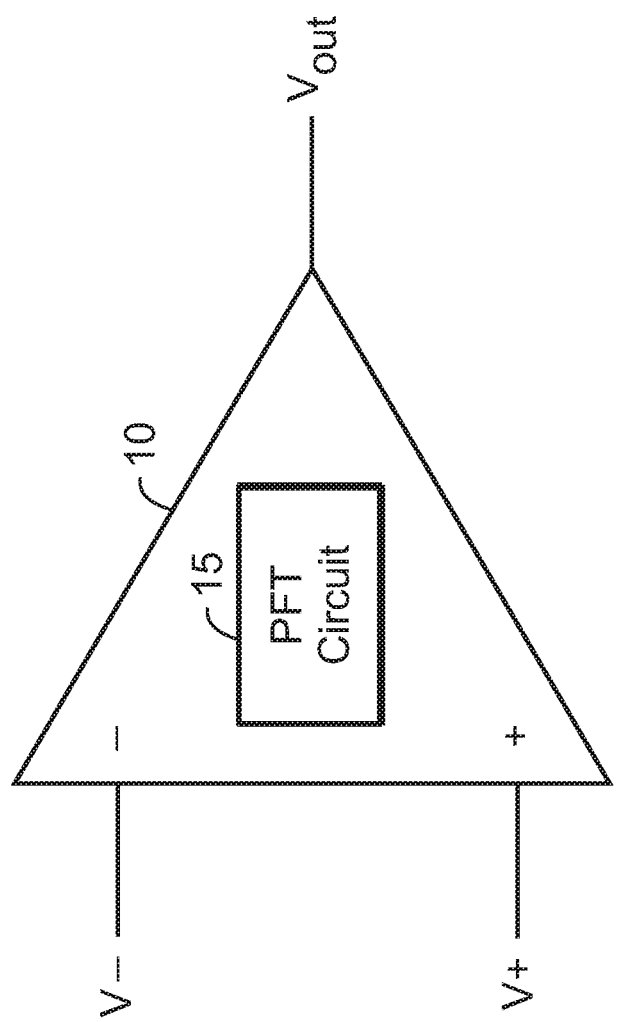
FIG. 1 shows a circuit arrangement for an amplifier according to an exemplary embodiment.

The disclosed concepts relate generally to amplifiers. More specifically, the disclosed concepts provide apparatus and methods for amplifiers with improved stability. The improved stability results from pole frequency tracking (PFT) circuitry used in amplifiers according to various embodiments, as described below in detail.

A variety of apparatus and associated methods are contemplated according to exemplary embodiments, including amplifiers or electronic circuitry or apparatus that include amplifiers. In various embodiments, the amplifier has two inputs, and an output. The amplifier has multiple poles in its transfer function, including typically a dominant pole. The dominant pole is usually at the output (arises because of the output circuitry of the amplifier and/or the load coupled to the output circuit of the amplifier) and the non-dominant poles are at the internal nodes (arise from the circuitry coupled to internal nodes of the amplifier. In various embodiments, the frequency of the dominant pole depends on the output current of the amplifier. The amplifier further includes PFT circuitry. In various embodiments, the PFT circuit includes a source follower circuit, as described below in detail.

Typically, output compensated amplifiers have the lowest frequency (dominant) pole at the output node. Usually, when the output current of the amplifier increases, the dominant pole tends to move to higher frequencies. Movement of the dominant pole to higher frequencies makes the amplifier circuit less stable.

In various embodiments, a source follower circuit is employed in local feedback circuit (as opposed to feedback circuitry external to the amplifier circuitry). The source follower circuit provides a shorter, faster and more current efficient implementation of pole frequency tracking compared to conventional approaches.

The source follower is used in a feedback circuit to track the frequency of the output (dominant) pole, hence the name PFT circuit. The output pole frequency varies as a function of variations in the output current of the amplifier. As the output pole frequency changes in response to changes in the output current of the amplifier, the feedback signal provided to an internal node of the amplifier also changes and the associated non-dominant pole frequency also changes in order to track or follow or match the changes in the pole frequency.

An op-amp or amplifier typically has multiple poles in its transfer function. Usually, frequency compensation is used with op-amps with multiple poles to make the op-amp stable. The designer can choose to implement frequency compensation by coupling a large enough capacitive load at the output of the op-amp, thus making the output pole dominant. On the other hand, the effects of the remaining (non-dominant) poles at the internal nodes of the op-amp remain.

In various embodiments, the current in the output node is sensed and the bias of an internal node is changed adaptively, using the source follower, so that the internal node (non-dominant) pole frequency tracks the movement of the dominant pole frequency, e.g., as the output current of the amplifier changes. As a result, the stability of the amplifier is preserved even at increased output current levels.

FIG. 1 shows a circuit arrangement for an amplifier 10 according to an exemplary embodiment. The amplifier 10 receives two input voltages, labeled V-(inverting input) and V+ (non-inverting input). In response to the difference between the two input voltages, the amplifier 10 produces an output voltage Vout, which is typically a scaled version of the difference between the two input voltages. In exemplary embodiments, the amplifier 10 may constitute an operational amplifier or op-amp.

In a typical use scenario, the output voltage Vout is provided to a load (not shown). In other words, a current flows to/from the output of the amplifier 10 to the load, depending on factors such as the output voltage of the amplifier 10, the type of load (e.g., impedance of the load), etc., as persons of ordinary skill in the art will understand.

Generally, for a given load, the output current of the amplifier 10 varies. For instance, in response to changes in the input voltages of the amplifier 10, the output current of the amplifier 10 also varies. Changes in the output current of the amplifier 10 change the location in frequency of the dominant pole of the transfer function (Vout/Vin, where Vin denotes the net input voltage of the amplifier 10, i.e., the difference between the two input voltages) of the amplifier 10.

The amplifier 10 includes a pole frequency tracking (PFT) circuit 15. As noted above, in response to changes in the output current, the dominant pole of the transfer function of the amplifier 10 would normally also move. For instance, in response to increases in the output current of the amplifier 10, the dominant pole would move to a higher frequency.

By virtue of using the PFT circuit 15, the non-dominant pole frequency at an internal node (or nodes) of the amplifier 10 tracks the changes in the frequency of the dominant pole of the amplifier 10. As a result, the stability of the amplifier 10 is preserved. In other words, the movement of the dominant pole does not cause instability of the amplifier 10. A reduction in the phase margin can occur, e.g., i.e. from 75 degrees to 70 degrees. The stability is nevertheless preserved because the phase margin is not below 0 degrees. In other words, use of the PFT circuit 15 limits or reduces the phase margin drop. Without the use of the PFT circuit 15, phase margin would drop towards zero degrees, which would make the circuit unstable eventually.

Figure 2:
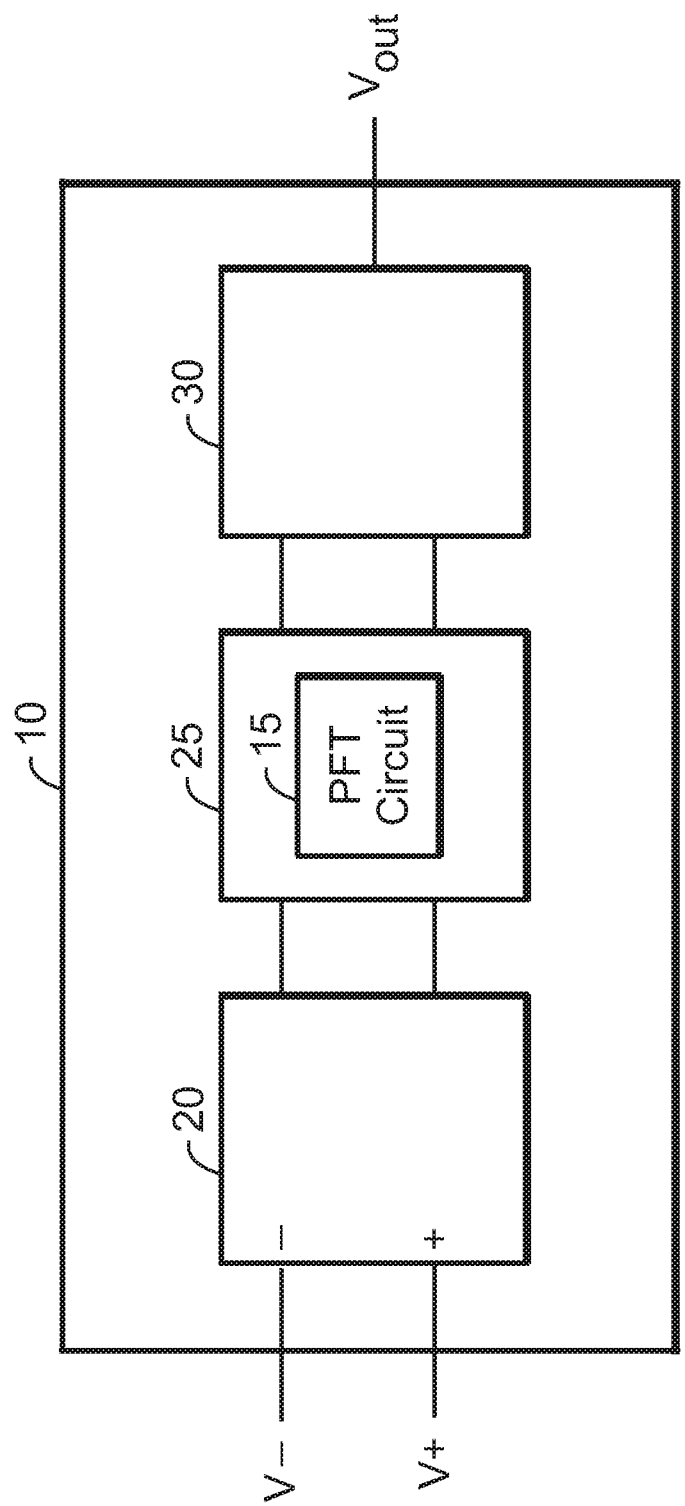
FIG. 2 shows a circuit arrangement for an amplifier according to an exemplary embodiment.

In various embodiments, the amplifier 10 has multiple stages. FIG. 2 shows a circuit arrangement for an amplifier 10 according to an exemplary embodiment. In the embodiment shown, the amplifier 10 has three stages: an input or first stage 20, a middle or second stage 25, and an output or third stage 30.

The first stage 20 receives the input voltages of the amplifier 10. The first stage in various embodiments produces an output voltage as a function of the input voltages, and provides that output voltage to the second stage 25. Typically, the first stage 20 generates an output voltage that is proportional (amplified version) of the difference between the input voltages of the amplifier 10.

The second stage 25 receives and processes the output voltage of the first stage 20 to generate an output voltage of the second stage 25. Typically, the second stage 25 amplifies the output voltage of the first stage 20.

The second stage 25 includes the PFT circuit 15. As noted above, the PFT circuit 15 tracks the changes in frequency of the dominant pole of the transfer function of the amplifier 10. As a result, the PFT circuit 15 provides the benefits described above.

The output voltage of the second stage 25 is fed to the third stage 30. The third stage 30 processes the output voltage of the second stage 25 to generate the output voltage of the amplifier 10, i.e., Vout. Typically, the third stage 30 provides additional gain and/or improved drive capability (more available output current).

Figure 3:
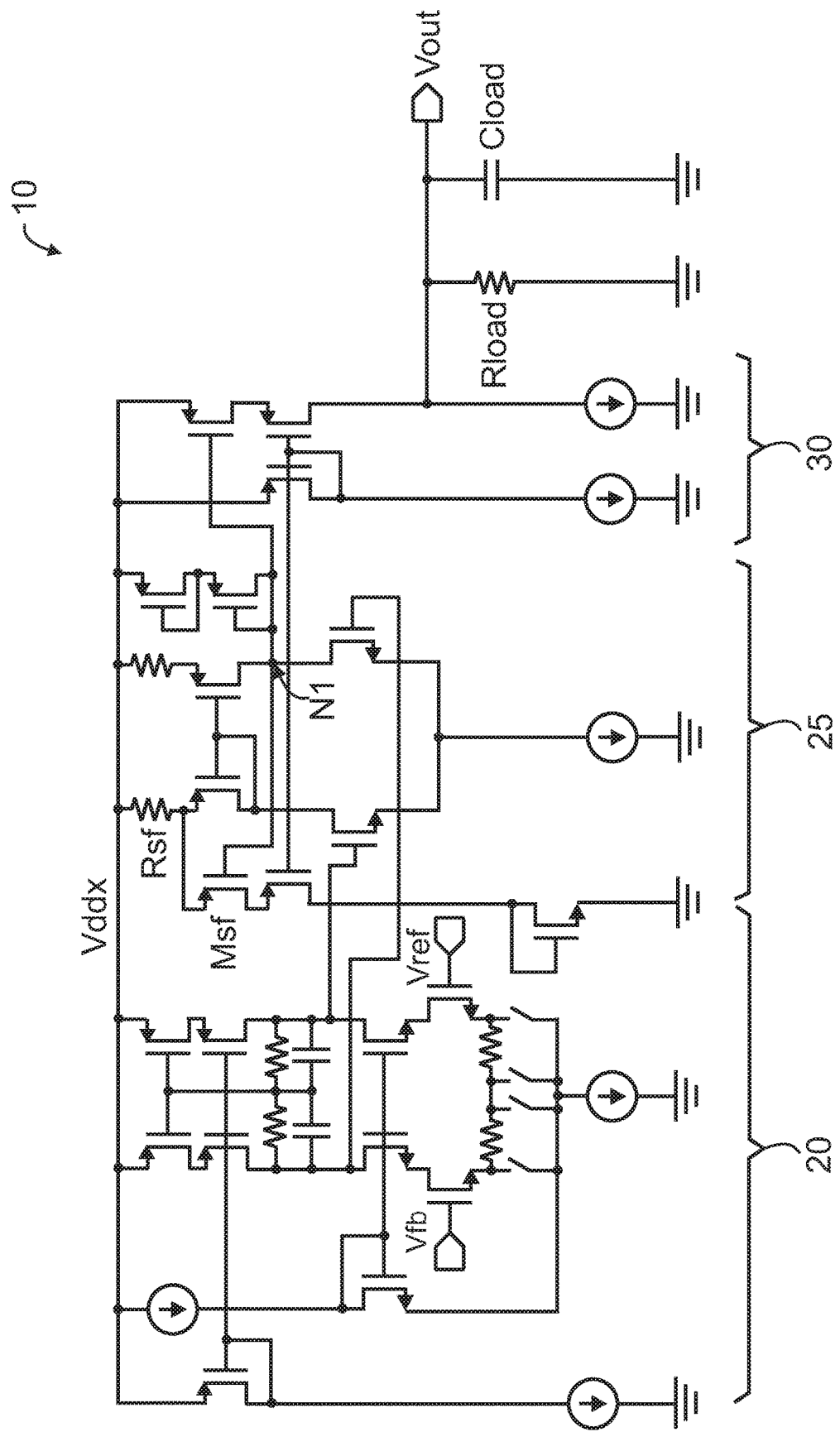
FIG. 3 shows a circuit arrangement for an amplifier according to an exemplary embodiment.

FIG. 3 shows a circuit arrangement for an amplifier 10 according to an exemplary embodiment. More specifically, in the embodiment shown, the figure shows the architecture of the amplifier 10, e.g., an op-amp. In the embodiment shown, the amplifier 10 is implemented using metal oxide semiconductor field effect transistors (MOSFETs).

The amplifier 10 in FIG. 3 has three stages, the first stage 20, the second stage 25, and the third stage 30. The first stage 20 is a fully differential output, telescopic cascode stage with an n-channel metal oxide semiconductor (NMOS) differential input pair. The common-mode feedback circuit is continuous and is implemented with resistors and capacitors. The first stage has a programmable offset trim functionality, which uses a number of switches coupled to resistors and to the differential input pair. The second stage 25 is an NMOS differential pair with an asymmetric active load. The third stage 30 is a p-channel MOS (PMOS) common-source stage. The source follower circuit includes transistor Msf and resistor Rsf. The internal node is node N1, which drives the gate of transistor Msf. Changes in the voltage at node N1 cause the drain current of transistor Msf to change accordingly.

The amplifier 10 may be used in a variety of circuits, as persons of ordinary skill in the art will understand. For example, in some situations, the amplifier 10 can be configured in a unity-gain configuration, and can be used as a voltage buffer.

The amplifier 10 is output compensated, as discussed above (frequency compensation is implemented by coupling a large enough capacitive load at the output of the amplifier, thus making the output pole dominant in the transfer function of the amplifier). Consequently, the dominant pole is at the output node (i.e., the frequency of the dominant pole depends on the circuitry present at the output of the amplifier 10), for instance, the load circuit. In the embodiment shown, the load circuit includes a resistor Rload and a capacitor Cload. Other types of load circuits may be used, as persons of ordinary skill in the art will understand.

Figure 4:
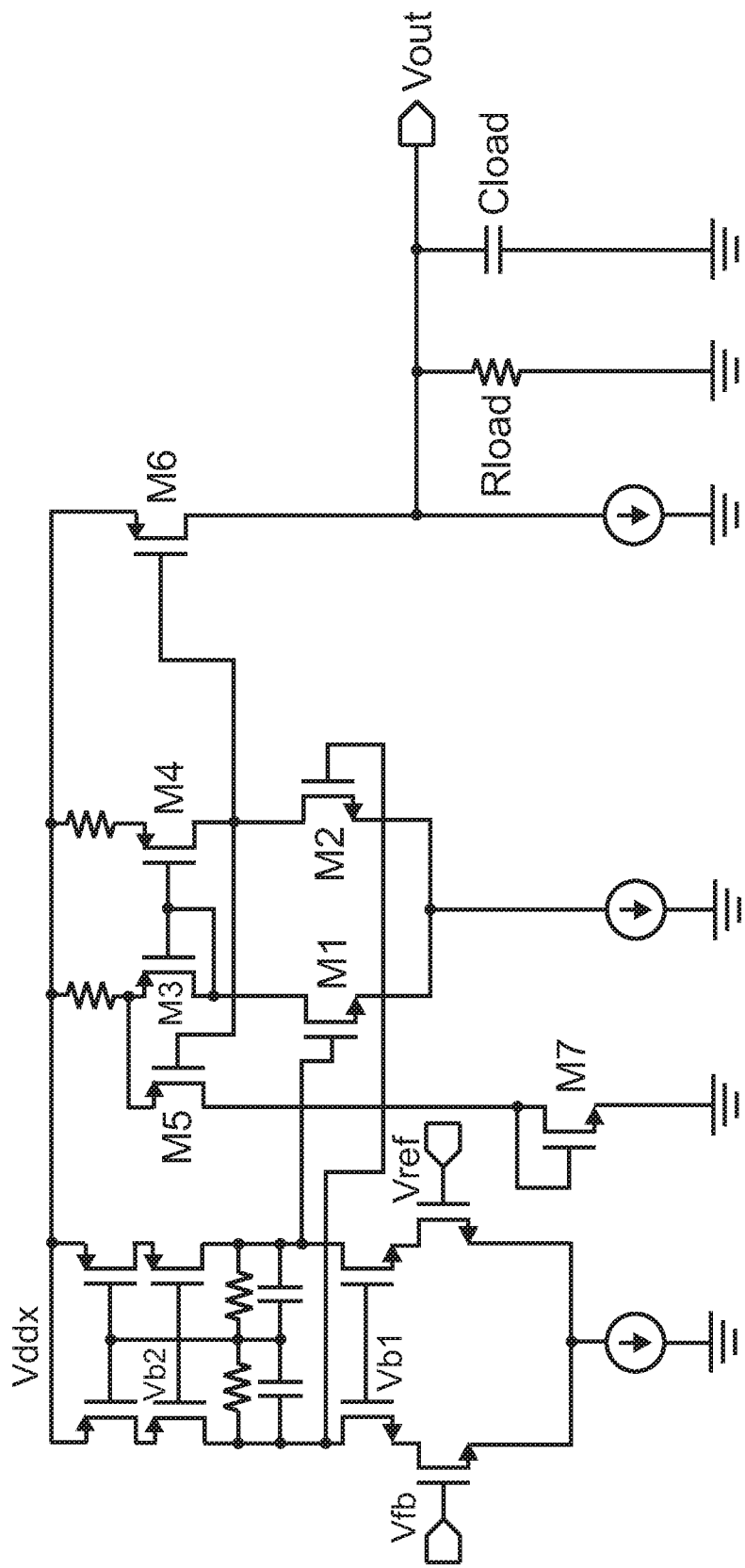
FIG. 4 shows a simplified circuit arrangement for an amplifier according to an exemplary embodiment.

FIG. 4 shows a simplified circuit arrangement for the amplifier 10 (see FIG. 3). Referring again to FIG. 4, the dominant pole of the transfer function of the amplifier 10 is located at the output of the amplifier 10. Other poles (non-dominant poles) are located at (determined by the circuitry at) the gate nodes of transistors M6, M1, and M2.

Usually, when the output current of the amplifier 10 increases, the dominant pole tends to move to higher frequencies, which ordinarily would make the amplifier 10 less stable. By virtue of the PFT circuit, implemented in the second stage 25, a local feedback circuit is implemented in the second stage 25 of the amplifier 10 to dynamically move the pole determined by the second stage 25 (i.e., the pole whose frequency depends on the circuitry in the second stage 25) to higher frequencies as the load current increases. Thus, the stability of the amplifier 10 is preserved.

Figure 5:
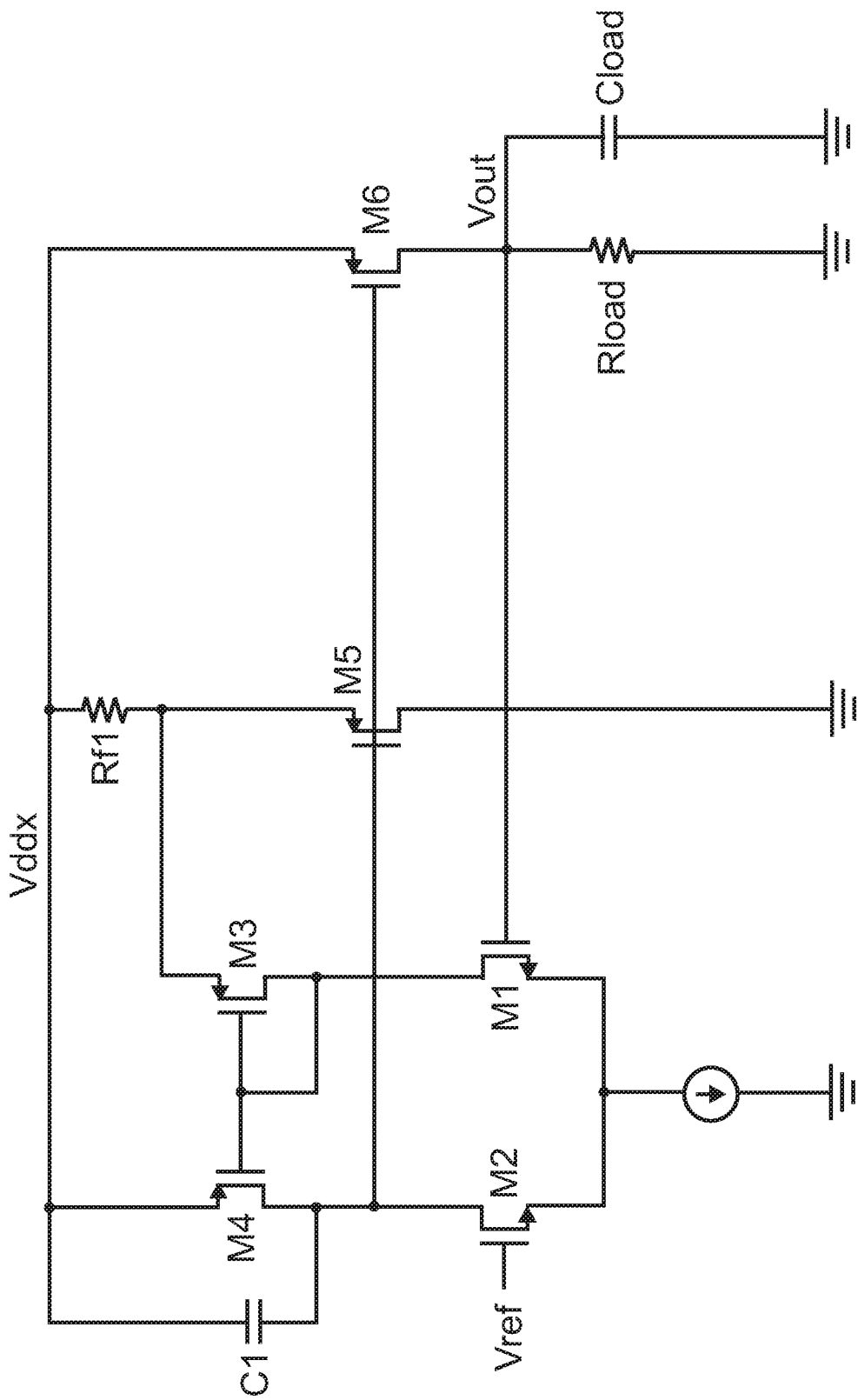
FIG. 5 shows a simplified circuit arrangement for an amplifier according to an exemplary embodiment.

The PFT circuit, including the local feedback circuit, operates as follows. To facilitate presentation, assume that the amplifier 10 includes the second stage 25 and the third stage 30, and is configured as a voltage follower. FIG. 5 shows this configuration.

More specifically, the non-inverting input of the amplifier 10 receives a voltage Vref. The inverting input of the amplifier 10 is coupled to receive a feedback voltage, Vfb, which may be the same as the output voltage Vout in a voltage follower configuration.

The amplifier 10 has a differential input pair that includes transistors M1 and M2, with an asymmetrical current mirror load that includes transistors M3 and M4. Capacitor C1 represents the circuit capacitances referred to the Vddx supply voltage, including the parasitic capacitances. The source of the transistor M4 is connected to the power supply voltage (Vddx), while the source of the transistor M3 is coupled to the local feedback node (the node coupled to the resistor Rf1, the source of the transistor M3, and the source of the transistor M5).

The local feedback circuit includes the transistor M5 and the resistor Rf1. The transistor M5 and the resistor Rf1 are configured as a source follower (common-drain) circuit. The local feedback circuit senses the voltage at the gate of the transistor M6, and feeds a current load dependent (i.e., dependent on the output current of the amplifier 10) feedback signal to the feedback node. The transistor M6 is in the third stage 30 of the amplifier 10, and provides the output current of the amplifier 10 to the load which, in the example shown, includes the resistor Rload and the capacitor Cload.

The transistor M3 feeds the feedback signal further to its drain and to its gate and to the gate of the transistor M4. The gate of the transistor M4 is therefore controlled partly by the local feedback signal and, thus, by the load current of the amplifier 10. As a result, the output impedance of the input stage becomes a function of the transconductance (gm) of the transistor M4, as evidenced in FIG. 6 (the input stage includes a differential pair (transistors M1 and M2), an asymmetric load (transistor M3 and transistor M4), and the bias current source coupled to the sources of transistors M1 and M2.

As noted above, the amplifier in various embodiments has multiple stages, e.g., three stages. Generally speaking, each additional gain stage will degrade the stability of the overall amplifier. Usually, the non-dominant pole associated with the second stage has more effect on the stability, since it sees (drives) the relatively large gate capacitance of the third stage. Still, it is up to the circuit designer to determine non-dominant pole placements by design choice, as persons of ordinary skill in the art will understand.

Figure 6:
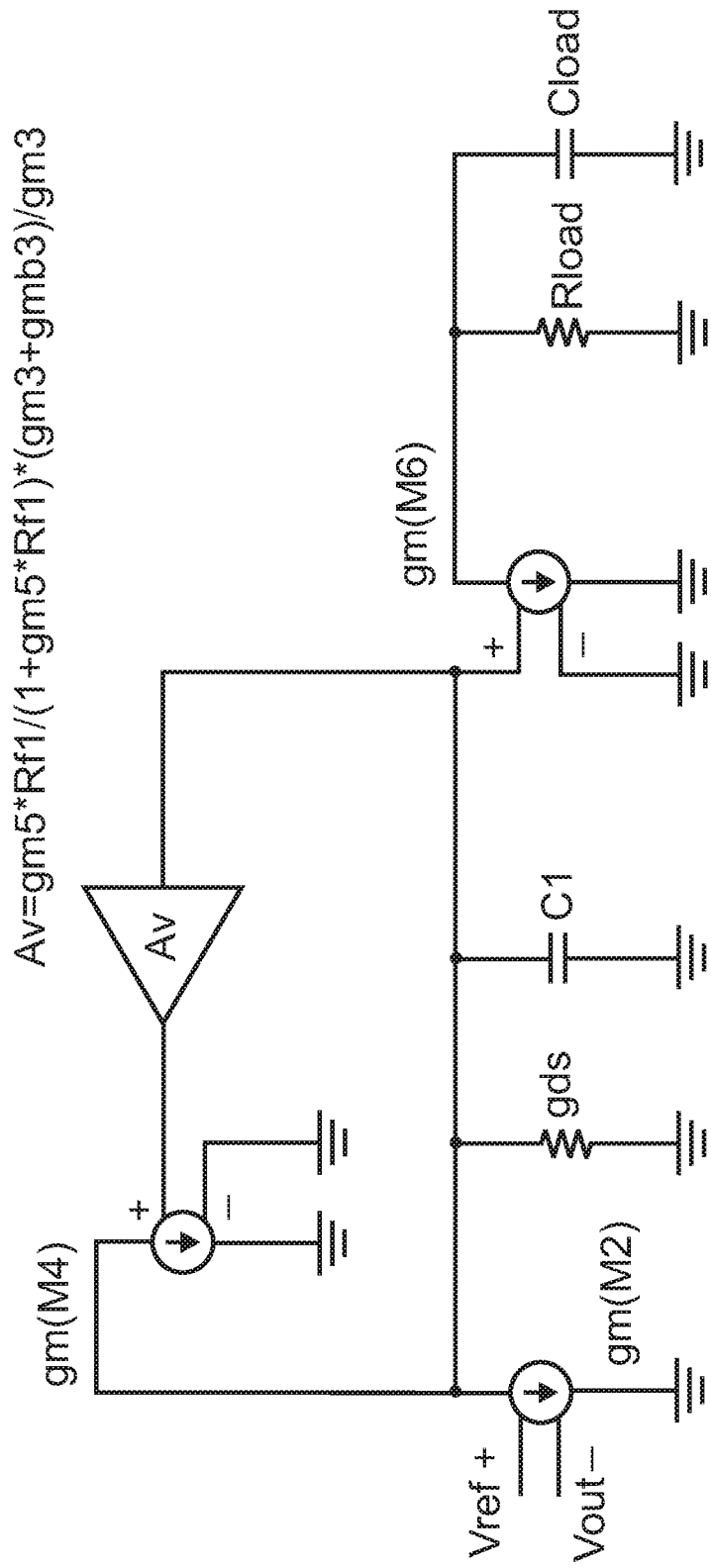
FIG. 6 shows a small signal model for an amplifier according to an exemplary embodiment.

FIG. 6 shows a small signal model for the amplifier 10. The various transistors are modeled each as a transconductance (gm) whose value depends on a voltage (gate-source voltage of the respective transistor). Note that the block labeled Av represents the local feedback loop. The gm(M6) block represents the transconductance of the transistor M6 which, as noted, drives the load at the output of the amplifier 10. The gds block presents the output conductance of the input stage of the circuit in FIG. 5. In other words, gds=gds (M2)+gds(M4). Capacitor C1 represents all the small signal capacitances coupled to the output of the input stage.

Referring again to FIG. 5, as the load current of the amplifier 10 increases, the output impedance of the input stage (the second stage 25 in the simplified diagram) decreases. As a result, the frequency associated with the pole for the second stage 25 moves to higher frequencies. In effect, the frequency of the pole associated with the second stage 25 tracks the changes in the frequency of the dominant pole, whose frequency changes in response to changes in the output current of the amplifier 10, as described above.

The embodiments described above represent merely some illustrative embodiments. Other embodiments are contemplated and are possible, as persons of ordinary skill in the art will understand. Some examples of such embodiments are described below.

Figure 7:
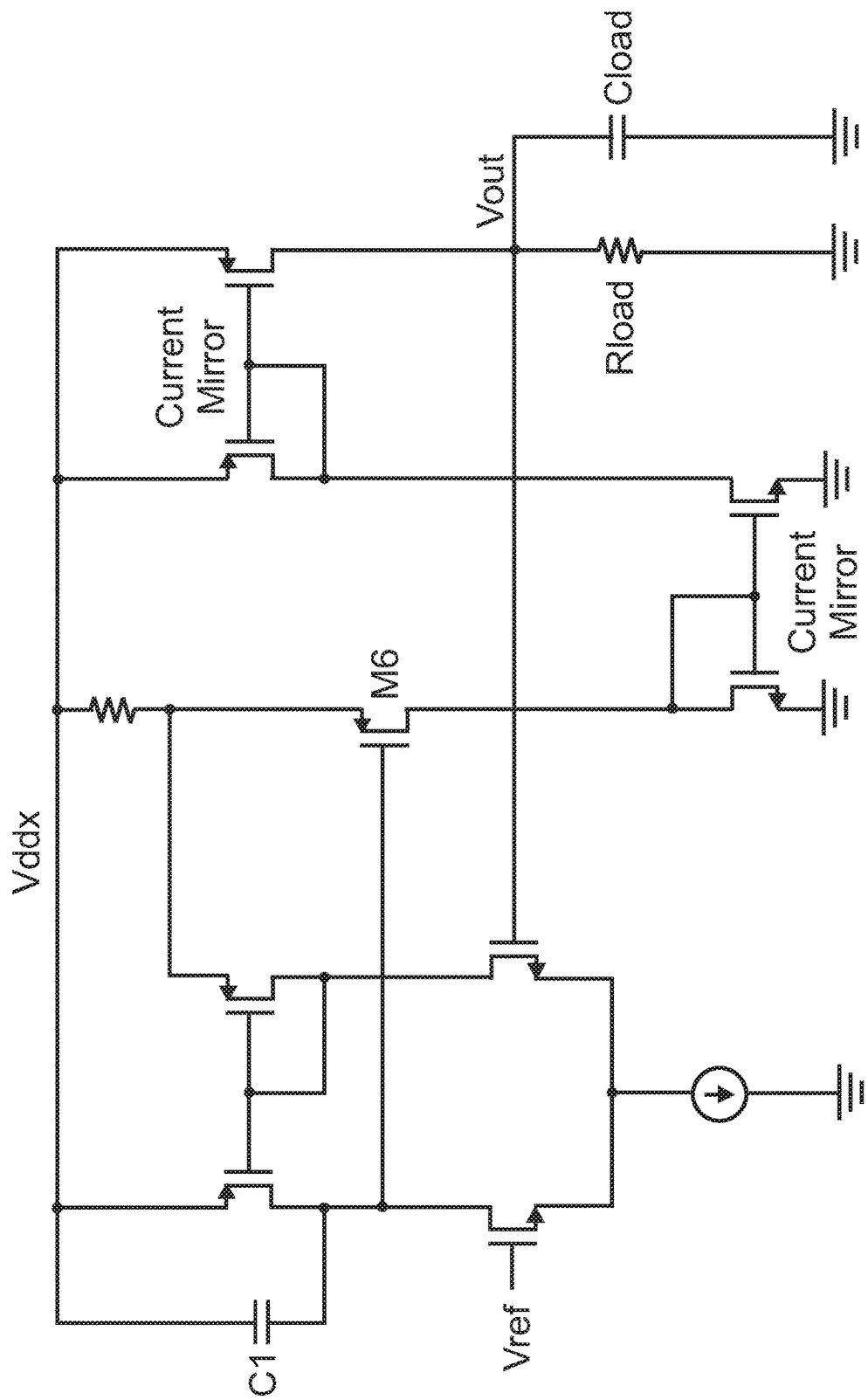
FIG. 7 shows a circuit arrangement for an amplifier according to an exemplary embodiment.

FIG. 7 shows a circuit arrangement for an amplifier 10 according to an exemplary embodiment. The circuit in FIG. 7 is similar to the simplified amplifier circuit in FIG. 5, but uses current mirrors. More specifically, referring to FIG. 7, one current mirror is used at the input stage. In addition, a second and a third current mirror (each labeled "current mirror") are used. The output of the second current mirror drives the diode-connected transistor in the third current mirror. The third current mirror drives the output of the amplifier 10. The transistor M6 is coupled in the source follower configuration, as described above.

Figure 8:
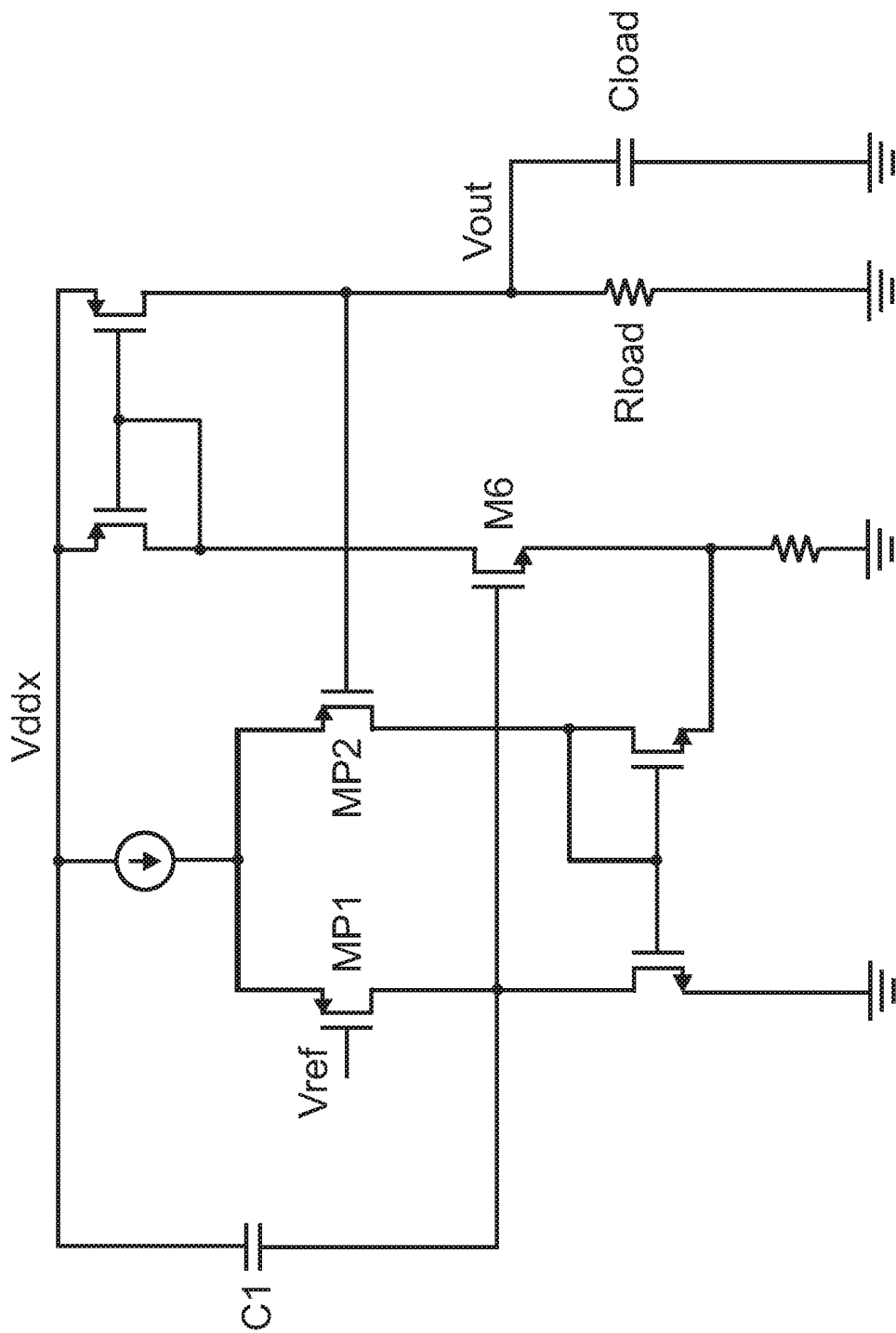
FIG. 8 shows a circuit arrangement for an amplifier according to an exemplary embodiment.

FIG. 8 shows a simplified circuit arrangement for an amplifier according to another exemplary embodiment. The circuit in FIG. 8 is similar to the simplified amplifier circuit in FIG. 5, but uses p-channel MOSFETs (PMOS transistors), whereas the circuit in FIG. 5 uses NMOS transistors. The input stage uses PMOS transistors MP1 and MP2 arranged as a differential pair. Note that, compared to the circuit in FIG. 5, the circuit in FIG. 8 uses an additional current mirror. The transistor M6 is coupled in the source follower configuration, as described above.

Figure 9:
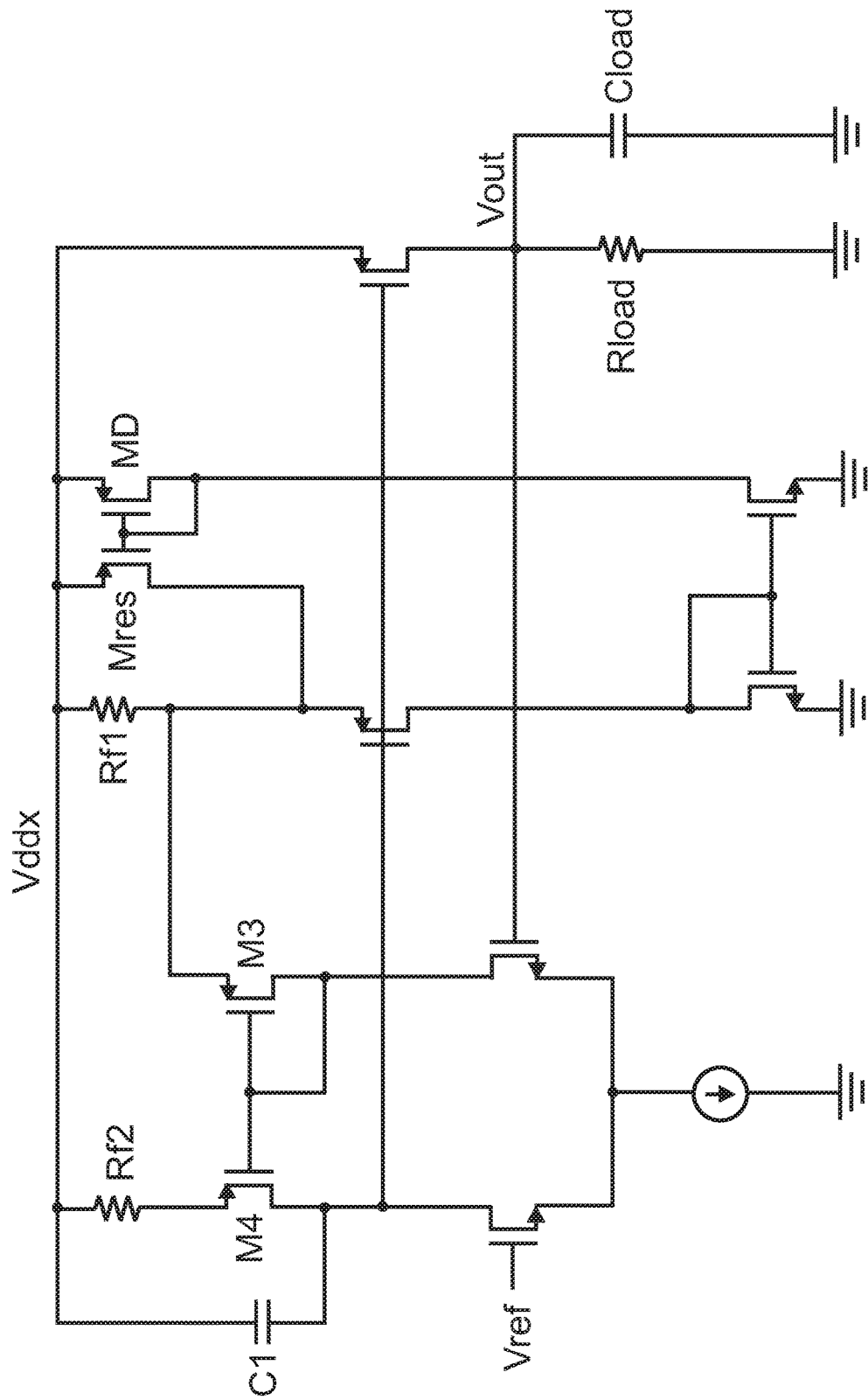
FIG. 9 shows a circuit arrangement for an amplifier according to an exemplary embodiment.

FIG. 9 shows a simplified circuit arrangement for an amplifier according to another exemplary embodiment. The circuit in FIG. 9 is similar to the simplified amplifier circuit in FIG. 5, but uses an additional resistor Rf2, coupled to the source of the transistor M4. This arrangement results in the input referred offset being smaller (than when Rf2 is not used) when the output current of the amplifier 10 is relatively low. Note that the resistor Rf2 may also be used in other embodiments, for example in the exemplary embodiments described above.

Referring again to FIG. 9, the feedback resistor is made dependent on the output current of the amplifier 10. More specifically, the resistance value of the transistor-implemented resistor Mres, is dependent on the output current of the amplifier 10.

As the load current of the amplifier 10 increases, the on-state resistance of Mres decreases. Consequently, the feedback resistor is effectively reduced when the output current of the amplifier is increased. Note that the resistor feedback adjustment scheme trades off the stability of the amplifier 10 for a better DC accuracy. This trade-off is acceptable as long as the phase margin of the amplifier 10 is within an acceptable range (e.g., as specified in the design or operational specifications of the amplifier 10) over the expected or specified range of the output current of the amplifier 10.

Figure 10:
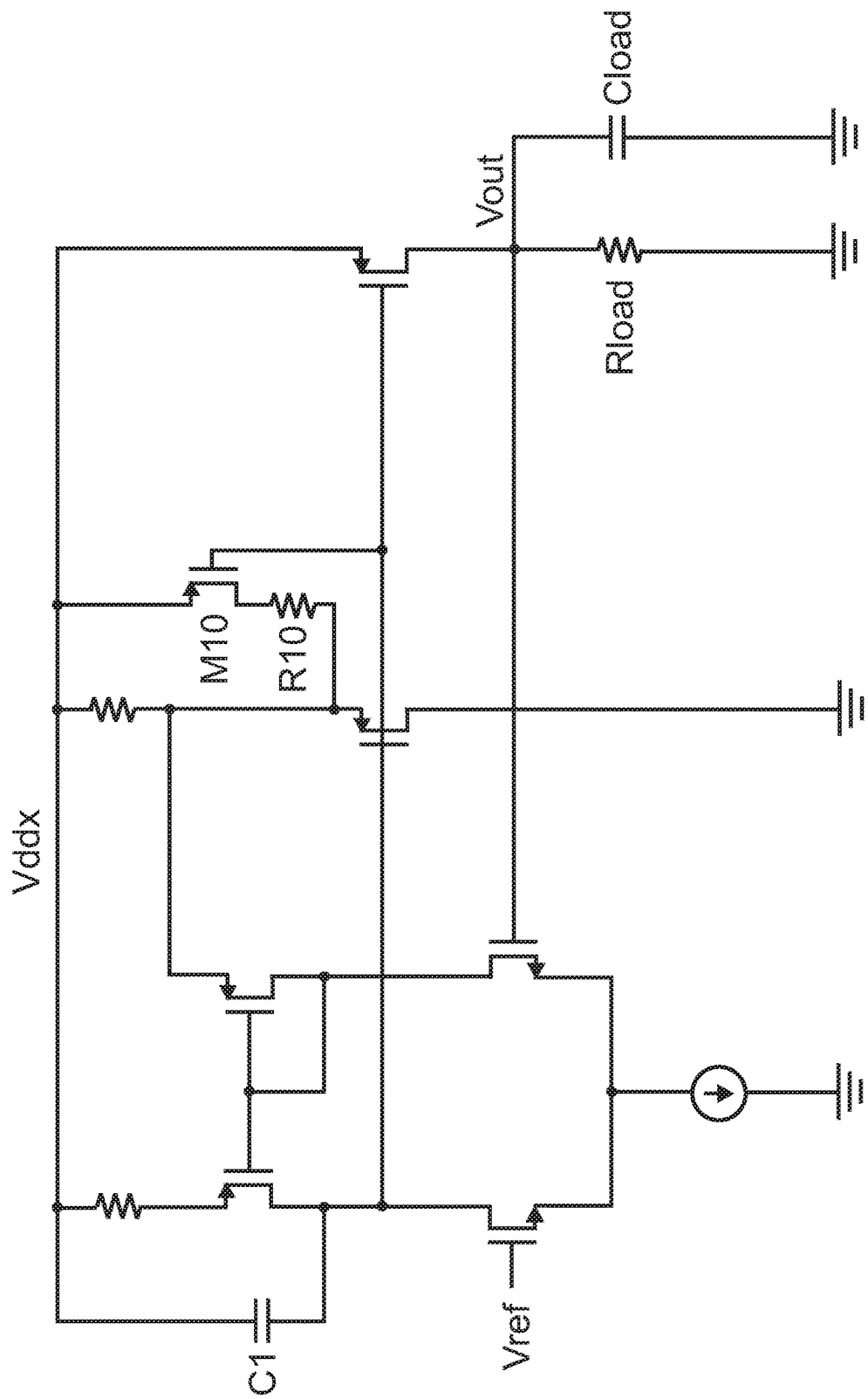
FIG. 10 shows a circuit arrangement for an amplifier according to an exemplary embodiment.

FIG. 10 shows a simplified circuit arrangement for an amplifier according to an exemplary embodiment. The circuit in FIG. 10 is similar to the simplified amplifier circuit in FIG. 5, but in FIG. 10, the resistor coupled to the source of the transistor M6 has a current-load-dependent part or portion, which includes the resistor R10 and the transistor M10.

More specifically, the feedback resistor is realized by using a resistor R10 coupled to a transistor M10. The transistor M10 is a PMOS transistor. The gate of the transistor M10 is driven by the output signal of the input stage differential pair, which is the same signal that drives the gate of the transistor that drives the output of the amplifier 10.

As the output current of the amplifier increases, the on-state resistance of the transistor M10 decreases. As the transistor M10 and the resistor R10 are coupled in series to the supply voltage Vddx, as the on-state resistance the transistor M10 decreases, the effective resistance at the source of the source follower transistor decreases, as a result of which less negative feedback is applied.

Note that various embodiments described above show choices for implementing various circuit blocks, parts, or elements. For example, various choices for implementing the local feedback circuit, including the feedback resistor, are shown. As persons of ordinary skill in the art will understand, other implementation choices are possible in other embodiments, and they are contemplated within the scope of the disclosure.

The choice of circuitry for a given implementation in an embodiment depends on a variety of factors, as persons of ordinary skill in the art will understand. Such factors include design specifications, performance specifications, cost, IC or device area, available technology, such as semiconductor fabrication technology), target markets, target end-users, etc.

As persons of ordinary skill in the art will understand, one may apply the disclosed concepts effectively to various electronic circuits. Examples described in this document (operational amplifiers) constitute merely illustrative applications, and are not intended to limit the application of the disclosed concepts to other circuitry that may be known by other names, such as general-purpose amplifiers, differential amplifiers, instrumentation amplifiers, comparators, etc., by making appropriate modifications, as persons of ordinary skill in the art will understand.

Referring to the figures, persons of ordinary skill in the art will note that the various blocks shown might depict mainly the conceptual functions and signal flow. The actual circuit implementation might or might not contain separately identifiable hardware for the various functional blocks and might or might not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation. Other modifications and alternative embodiments in addition to the embodiments in the disclosure will be apparent to persons of ordinary skill in the art. Accordingly, the disclosure teaches those skilled in the art the manner of carrying out the disclosed concepts according to exemplary embodiments, and is to be construed as illustrative only. Where applicable, the figures might or might not be drawn to scale, as persons of ordinary skill in the art will understand.

The particular forms and embodiments shown and described constitute merely exemplary embodiments. Persons skilled in the art may make various changes in the shape, size and arrangement of parts without departing from the scope of the disclosure. For example, persons skilled in the art may substitute equivalent elements for the elements illustrated and described. Moreover, persons skilled in the art may use certain features of the disclosed concepts independently of the use of other features, without departing from the scope of the disclosure.

The invention claimed is:

1. An apparatus comprising an amplifier having first and second inputs and an output, the amplifier having a pole and a non-dominant pole in a transfer function of the amplifier, wherein a frequency of the pole depends on an output current of the amplifier, the amplifier comprising a pole frequency tracking (PFT) circuit, comprising a source follower circuit, to change a frequency of the non-dominant pole.

2. The apparatus according to claim 1, wherein the pole comprises a dominant pole.

3. The apparatus according to claim 1, wherein the frequency of the pole depends on a load coupled to the output of the amplifier.

4. The apparatus according to claim 1, wherein the amplifier comprises a differential pair with an asymmetrical current mirror load.

5. The apparatus according to claim 1, wherein an output circuit of the amplifier comprises a first transistor, and wherein the source follower circuit comprises a second transistor to sense a gate voltage of the first transistor and to provide a feedback signal that depends on the output current of the amplifier.

6. The apparatus according to claim 1, wherein the amplifier comprises a first stage to receive signals applied to the first and second input of the amplifier, a second stage to receive an output of the first stage and to provide an output signal to a third stage, wherein the third stage provides the output signal of the amplifier.

7. The apparatus according to claim 6, wherein the second stage comprises the PFT circuit.

8. The apparatus according to claim 1, wherein the PFT circuit comprises a feedback circuit that causes the frequency of the non-dominant pole to follow the frequency of the pole whose frequency depends on the output current of the amplifier, the non-dominant pole being at an internal node of the amplifier.

9. The apparatus according to claim 1, wherein the PFT circuit comprises the source follower circuit, and wherein the source follower circuit causes an output impedance of an input stage of the amplifier to vary as a function of the output current of the amplifier.

10. An apparatus comprising:
   an operational amplifier having first and second inputs and an output, the operational amplifier having a non-dominant pole, the operational amplifier comprising:
      a first stage to receive first and second input signals;
      a second stage coupled to the first stage, the second stage comprising a pole frequency tracking (PFT) circuit, wherein the PFT circuit comprises a feedback loop to provide a feedback signal as a function of an output current of the operational amplifier to change a frequency of the non-dominant pole; and
      a third stage coupled to the second stage, the third stage providing the output current of the operational amplifier at the output.

11. The apparatus according to claim 10, wherein the PFT circuit comprises a source follower circuit.

12. The apparatus according to claim 10, wherein the PFT circuit tracks a frequency of a pole in a transfer function of the operational amplifier.

13. The apparatus according to claim 12, wherein the pole comprises a dominant pole.

14. The apparatus according to claim 10, wherein a frequency of a pole of the operational amplifier varies as a function of the output current of the operational amplifier, and wherein the PFT circuit causes the frequency of the non-dominant pole to follow the frequency of the pole in order to preserve stability of the operational amplifier, the non-dominant pole being at an internal node of the operational amplifier.

15. A method of operating an amplifier, the amplifier having a non-dominant pole and an output to drive a load, wherein a frequency of a pole of the amplifier varies as a function of an output current of the amplifier, the method comprising using a pole frequency tracking (PFT) circuit to provide a feedback signal to preserve stability of the amplifier by changing a frequency of the non-dominant pole.

16. The method according to claim 15, wherein the pole comprises a dominant pole of a transfer function of the amplifier.

17. The method according to claim 15, wherein using the PFT circuit to provide the feedback signal to preserve stability of the amplifier further comprises using a source follower circuit.

18. The method according to claim 15, wherein using the PFT circuit to provide the feedback signal further comprises using the feedback signal to cause the frequency of the non-dominant pole to track the frequency of the pole, the non-dominant pole being at an internal node of the amplifier.

19. The method according to claim 15, wherein using the PFT circuit to provide the feedback signal further comprises changing an output impedance of an input stage of the amplifier in response to the feedback signal.

20. The method according to claim 15, wherein the frequency of the pole depends on a load coupled to the output of the amplifier.

* * * * *